US006173468B1

(12) United States Patent
Yonemizu et al.

(10) Patent No.: US 6,173,468 B1
(45) Date of Patent: Jan. 16, 2001

(54) APPARATUS FOR WASHING BOTH SURFACES OF A SUBSTRATE

(75) Inventors: Akira Yonemizu, Kumamoto; Yuji Matsuyama, Kikuchi-gun, both of (JP)

(73) Assignee: Tokyo Electron Limited, Tokyo (JP)

( * ) Notice: Under 35 U.S.C. 154(b), the term of this patent shall be extended for 0 days.

(21) Appl. No.: 09/333,915

(22) Filed: Jun. 16, 1999

Related U.S. Application Data

(62) Division of application No. 09/026,912, filed on Feb. 20, 1998, now Pat. No. 5,958,145.

(30) Foreign Application Priority Data

Feb. 28, 1997 (JP) .................................................. 9-062208

(51) Int. Cl.[7] .............................. B08B 1/04; B08B 3/00; B08B 3/10
(52) U.S. Cl. ................................. 15/77; 15/88.2; 15/102
(58) Field of Search ........................... 15/21.1, 77, 88.2, 15/88.3, 97.1, 102; 134/902

(56) References Cited

U.S. PATENT DOCUMENTS

| 5,345,639 | 9/1994 | Tanoue et al. ............... 15/88.2 |
| 5,351,360 | 10/1994 | Suzuki et al. ................ 15/302 |
| 5,498,294 | 3/1996 | Matsushita et al. ............ 134/6 |
| 5,518,542 | 5/1996 | Matsukawa et al. ........... 118/52 |
| 5,636,401 | 6/1997 | Yonemizu et al. .............. 15/77 |
| 5,651,160 | 7/1997 | Yonemizu et al. ............. 15/302 |
| 5,745,946 | * 5/1998 | Thrasher et al. .............. 15/77 |
| 5,858,112 | 1/1999 | Yonemizu et al. ............. 134/6 |
| 5,861,066 | 1/1999 | Moinpour et al. ............. 134/6 |
| 5,862,560 | 1/1999 | Jensen et al. ................. 15/77 |

FOREIGN PATENT DOCUMENTS 59-228932 * 12/1984 (JP) .

* cited by examiner

Primary Examiner—Mark Spisich
(74) Attorney, Agent, or Firm—Oblon, Spivak, McClelland, Maier & Neustadt, P.C

(57) ABSTRACT

A method for washing both surfaces of a substrate, comprising (a) a first washing step for washing a front surface of a substrate, which is kept rotated, by bringing a scrubbing member into contact with said front surface of the substrate while supplying a washing liquid onto the front surface, (b) a second washing step for washing a back surface of the substrate, which is kept rotated, by bringing a scrubbing member into contact with said back surface of the substrate while supplying a washing liquid onto the back surface, (c) a heating step for drying under heat the wet surfaces of the substrate, (d) a recipe determining step for determining whether said heating step (c) is performed, at a period between said first washing step (a) and second washing step (b) and at a period after the second washing step (b), whether the heating step (c) is performed only once after the second washing step (b), or whether the heating step (c) is not performed, and (e) a conducting step for performing or not performing the heating step (C) in accordance with the recipe determined in said recipe determining step (d).

7 Claims, 5 Drawing Sheets

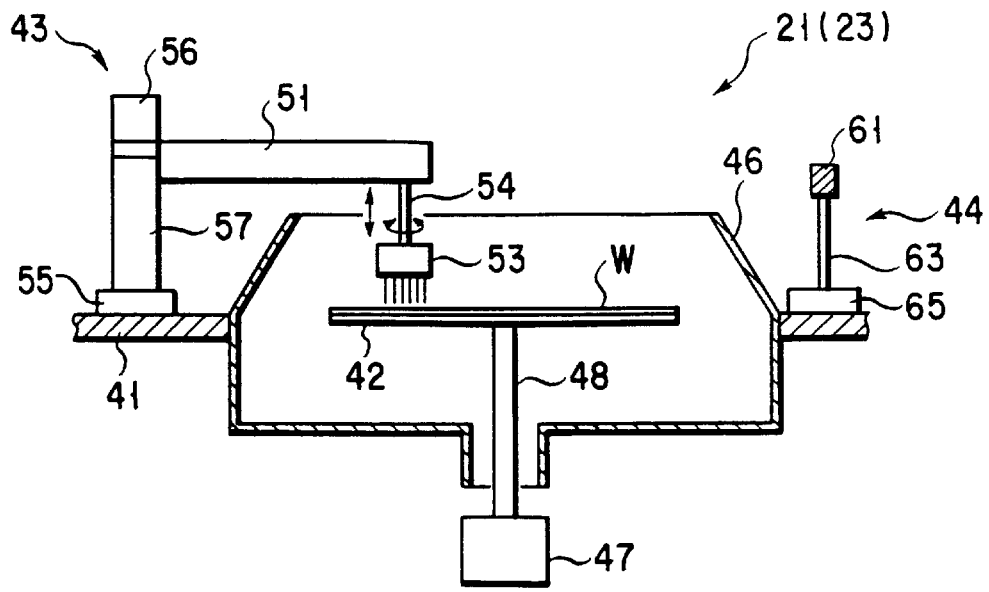
F I G. 2
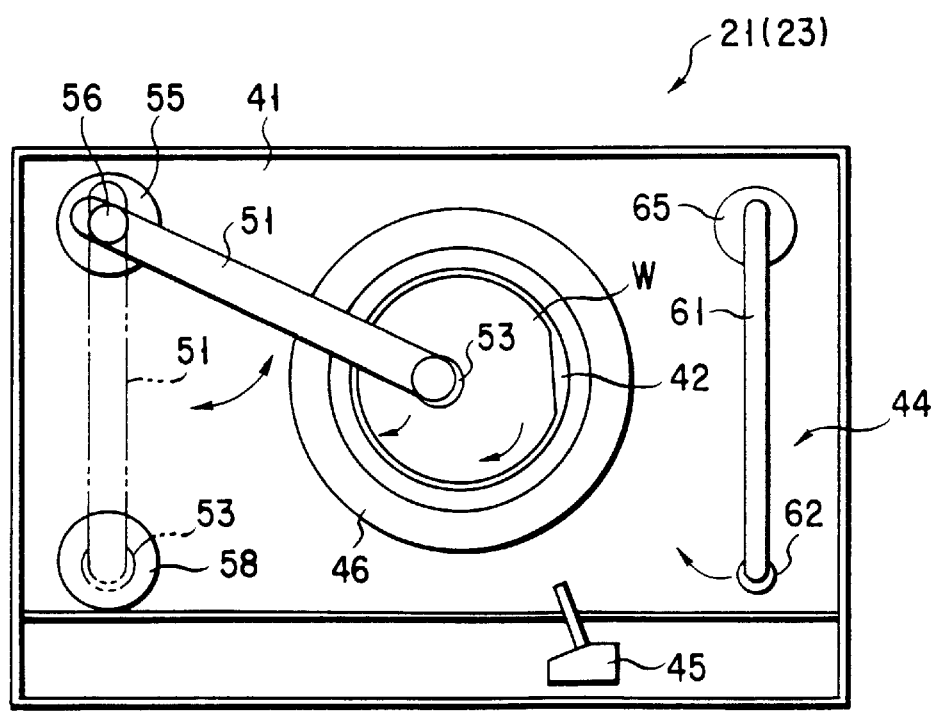
F I G. 3

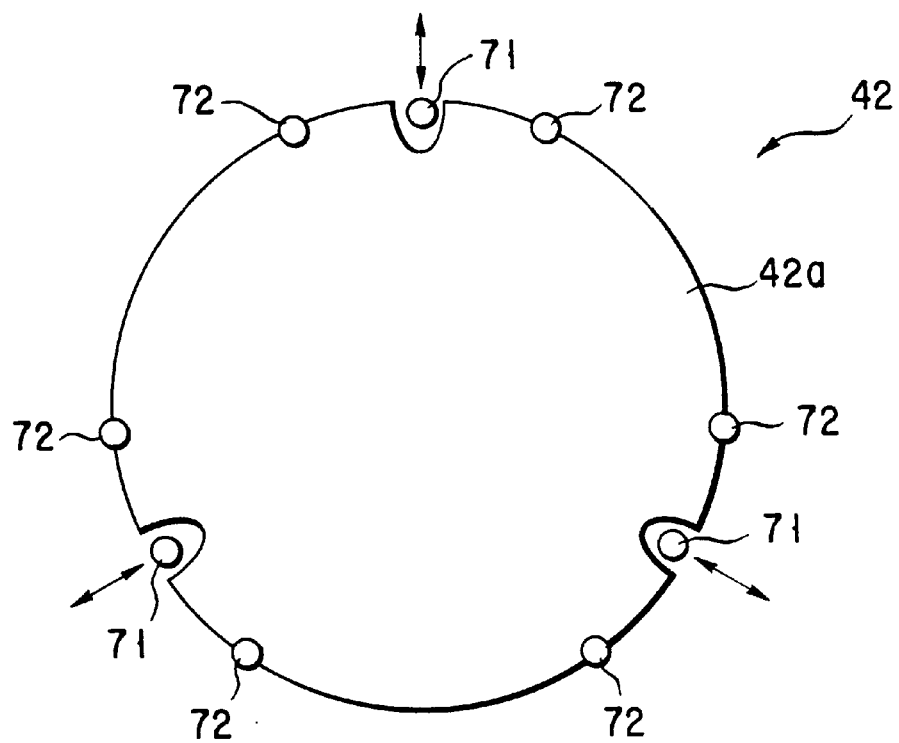
F I G. 4
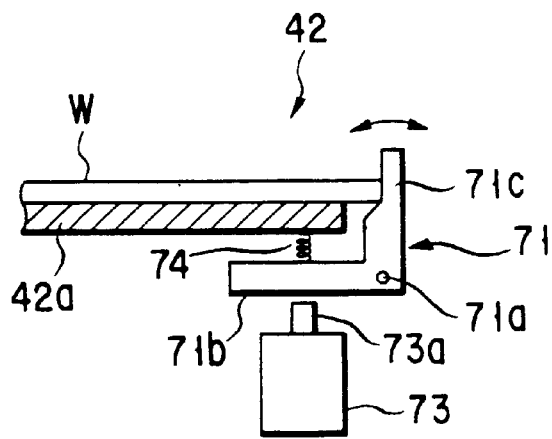
F I G. 5

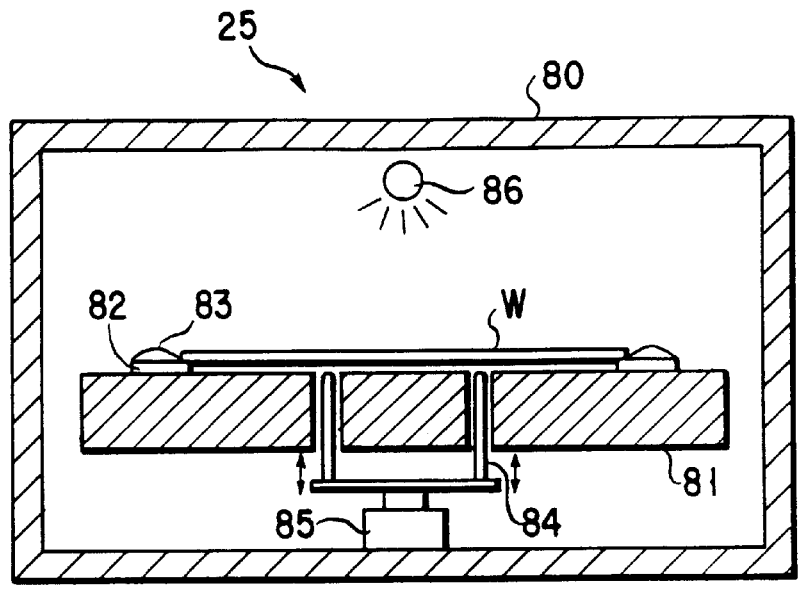
F I G. 6
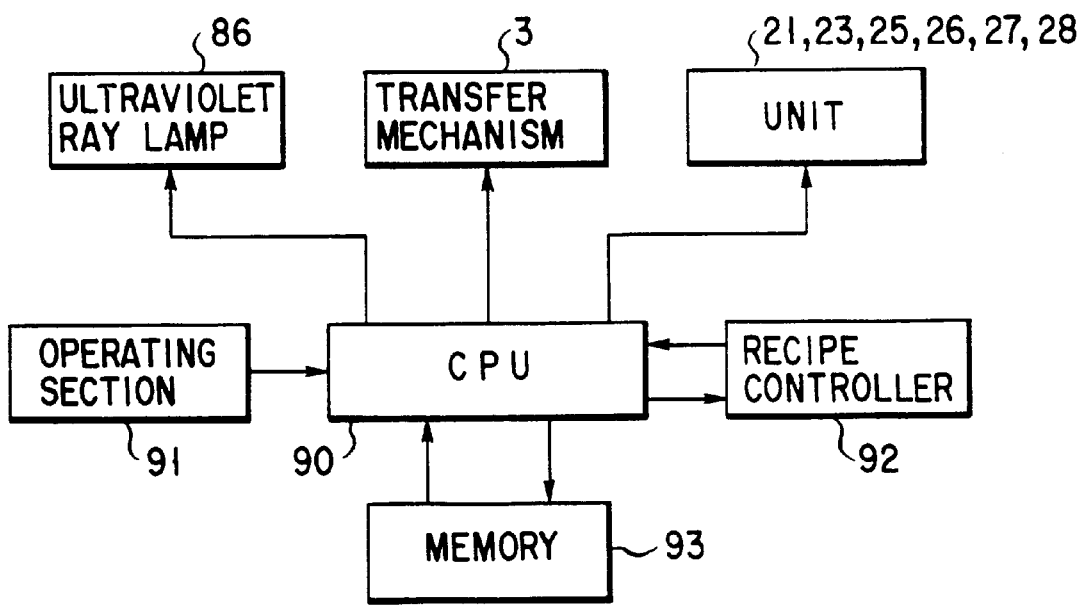
F I G. 7

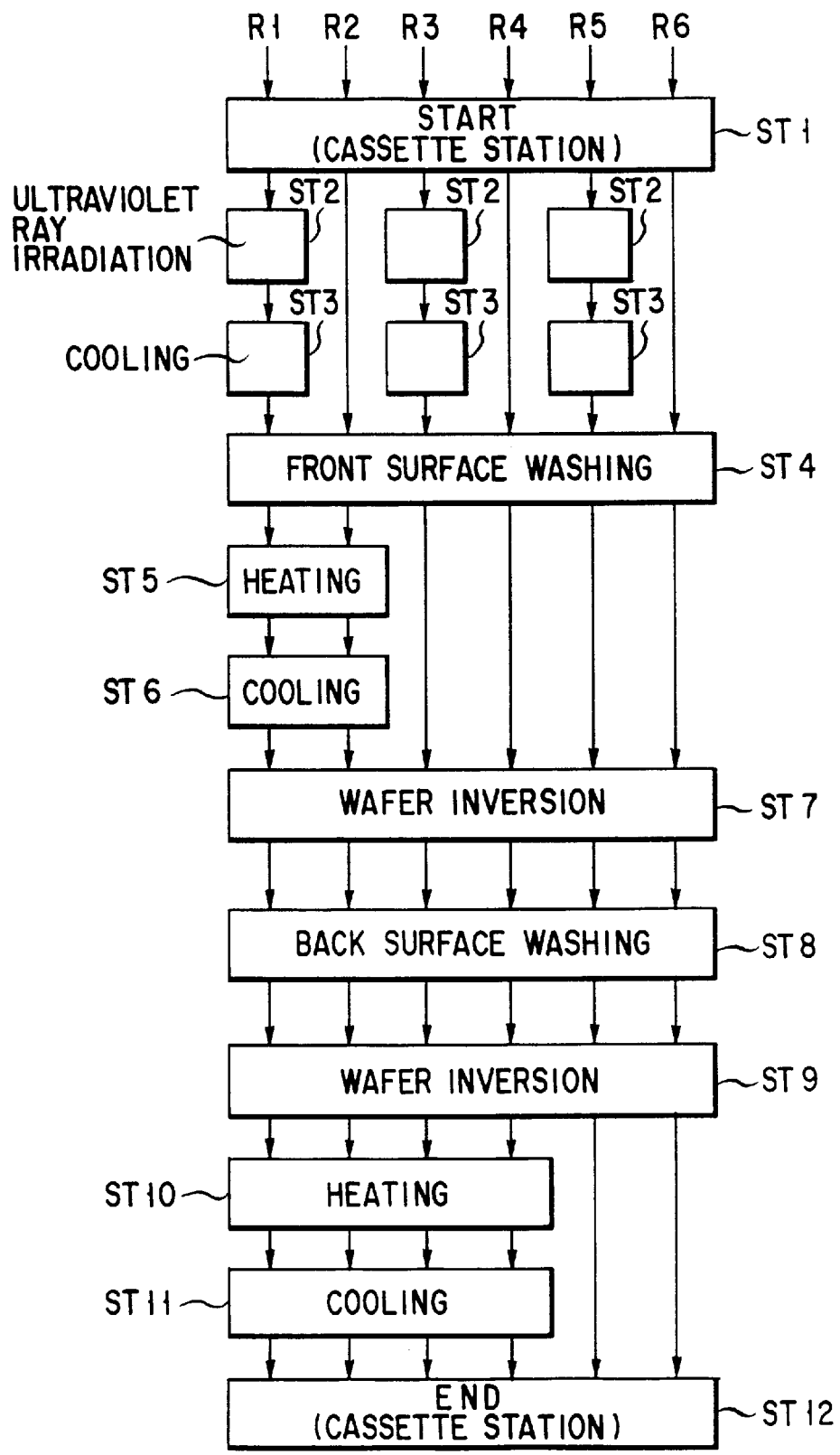
F I G. 8

APPARATUS FOR WASHING BOTH SURFACES OF A SUBSTRATE

This application is a Division of application Ser. No. 09/026,912 Filed on Feb. 20, 1998, now U.S. Pat. No. 5,958,145.

BACKGROUND OF THE INVENTION

The present invention relates to a method and apparatus for washing both surfaces of a substrate such as a semiconductor wafer and an LCD (liquid crystal device) substrate.

In the manufacturing process of a semiconductor device, a photolithography technology is employed for forming a circuit, an electrode pattern, etc. on a semiconductor wafer. In the photolithography technology, a semiconductor wafer is coated with a photoresist solution. Then, the resist coating film is exposed to light, followed by a developing treatment with a developing solution. It should be noted that, before a series of the resist processing noted above, a front surface of the wafer which is to be coated with a resist solution is washed in order to prevent defect occurrence in the circuit pattern and short-circuiting of the wiring layers. It is also necessary to wash a back surface of the wafer in order to prevent mis-focussing in the light-exposure step and particle generation.

It was customary in the past to use a scrubbing device for brushing both surfaces of a semiconductor wafer, while supplying a washing liquid to the wafer, for washing the wafer. In general, the washing device of this type includes a front surface washing unit, a back surface washing unit, a wafer reversion unit, a heating unit and a cooling unit, which are arranged to have a transfer path sandwiched therebetween. When the washing device is used for washing a semiconductor wafer, the wafer is successively transferred by a transfer mechanism into each of the front surface washing unit, etc. in accordance with a predetermined recipe, thereby applying predetermined treatments to the wafer.

In the washing treatment of this type, however, a wide range of applicability which permits application to different specifications required by various users is required in, for example, the drying treatment. It follows that it is insufficient to apply a washing treatment to a substrate in accordance with a single recipe.

BRIEF SUMMARY OF THE INVENTION

An object of the present invention is to provide a method and apparatus for washing both surfaces of a substrate, which are capable of coping with various washing specifications.

According to a first aspect of the present invention, there is provided a method for washing both surfaces of a substrate, comprising:

(a) a first washing step for washing a front surface of a substrate, which is kept rotated, by bringing a scrubbing member into contact with the front surface of the substrate while supplying a washing liquid onto the front surface;

(b) a second washing step for washing a back surface of the substrate, which is kept rotated, by bringing a scrubbing member into contact with the back surface of the substrate while supplying a washing liquid onto the back surface;

(c) a heating step for drying under heat the wet surfaces of the substrate;

(d) a recipe determining step for determining whether the heating step (c) is performed twice, i.e., at a period between the first washing step (a) and the second washing step (b) and at a period after the second washing step (b), respectively, whether the heating step (c) is performed only once after the second washing step (b), or whether the heating step (c) is not performed; and (e) a conducting step for performing or not performing the heating step (c) in accordance with the recipe determined in the recipe determining step.

According to a second aspect of the present invention, there is provided a method for washing both surfaces of a substrate, comprising:

(A) a first washing step for washing a front surface of a substrate, which is kept rotated, by bringing a scrubbing member into contact with the front surface of the substrate while supplying a washing liquid onto the front surface;

(B) a second washing step for washing a back surface of the substrate, which is kept rotated, by bringing a scrubbing member into contact with the back surface of the substrate while supplying a washing liquid onto the back surface;

(C) a heating step for drying under heat the wet surfaces of the substrate;

(D) a first recipe determining step for determining whether the heating step (C) is performed twice, i.e., at a period between the first washing step (A) and the second washing step (B) and at a period after the second washing step (B), respectively, whether the heating step (C) is performed only after the second washing step (B), or whether the heating step (C) is not performed;

(E) a conducting step for performing or not performing the heating step (C) in accordance with the recipe determined in the recipe determining step;

(F) a second recipe determining step for determining whether or not the front surface of the substrate should be irradiated with an ultraviolet light before the first washing step (A); and (G) an ultraviolet light irradiation step for irradiating the front surface of the substrate with an ultraviolet light in accordance with the recipe determined in the second recipe determining step (D).

According to a third aspect of the present invention, there is provided an apparatus for washing both surfaces of a substrate, comprising: a spin chuck for holding and rotating a substrate; a first washing section in which a scrubbing member is brought into contact with a front surface of a substrate, which is kept rotated, while supplying a washing liquid onto the front surface of the substrate for washing the front surface; a second washing section in which a scrubbing member is brought into contact with a back surface of the substrate, which is kept rotated, while supplying a washing liquid onto the back surface of the substrate for washing the back surface; a heating section for drying under heat the wet substrate; a transfer arm mechanism for transferring the substrate into each of the first washing section, the second washing section, and the heating section; a recipe controller for controlling the first and second washing sections to permit the substrate to be washed in the second washing section after the substrate washing in the first washing section, and for determining whether the substrate should be dried twice in the heating section, i.e., between the washing in the first washing section and the washing in the second washing section and after the washing in the second washing section, respectively, whether the substrate should be dried only once after the washing in the second washing section, or whether the substrate should not be dried in the heating section; and control means for controlling the heating in the heating section on the basis of the recipe determined in the recipe controller.

According to a fourth aspect of the present invention, there is provided an apparatus for washing both surfaces of a substrate; comprising: an ultraviolet light irradiation section equipped with ultraviolet light irradiating means for irradiating a front surface of a substrate with an ultraviolet light; a spin chuck for holding and rotating a substrate; a first washing section in which a scrubbing member is brought into contact with a front surface of a substrate, which is kept rotated, while supplying a washing liquid onto the front surface of the substrate for washing the front surface; a second washing section in which a scrubbing member is brought into contact with a back surface of the substrate, which is kept rotated, while supplying a washing liquid onto the back surface of the substrate for washing the back surface; a heating section for drying under heat the wet substrate; a transfer arm mechanism for transferring the substrate into each of the first washing section, the second washing section, and the heating section; a recipe controller for controlling the first and second washing sections to permit the substrate to be washed in the second washing section after the substrate washing in the first washing section, for determining whether an ultraviolet light irradiation should be performed by the ultraviolet light irradiation means before the washing in the first washing section, and for determining whether the substrate should be dried twice in the heating section, i.e., between the washing in the first washing section and the washing in the second washing section and after the washing in the second washing section, respectively, whether the substrate should be dried only once after the washing in the second washing section, or whether the substrate should not be dried in the heating section; and control means for controlling the heating in the heating section on the basis of the recipe determined in the recipe controller.

In the present invention according to the first and third aspects described above, the heating step for drying the substrate after the washing step can be performed in various modes, making it possible to cope with various specifications. To be more specific, where a substrate is washed with a washing liquid while rotating the substrate, the substrate is further rotated after the washing step so as to centrifugally separate the washing liquid from the substrate in this case, the washing liquid scarcely remains on the substrate surface, with the result that it is not absolutely necessary to perform the heating step (c) for the drying purpose. Where it is necessary to remove completely the residual washing liquid for drying the substrate surface, it is possible to perform the heating step (c) again after the second washing step. Further, it is also possible to perform the heating step (C) after the first washing step and after the second washing step. Since these three heating modes can be selectively employed, the washing treatment having a very high degree of freedom can be achieved.

In the present invention according to the second and fourth aspects of the present invention, it is possible to select various heating modes after the washing of the substrate with a washing liquid. In addition, the ultraviolet light irradiation before the washing step can be selectively employed, leading to a further improved degree of freedom in the washing treatment.

In the present invention according to the first and second aspects of the present invention, it is desirable for the washing method to include a cooling step for cooling the substrate after the heating step (c) or (C). Also, in the washing method of the second aspect, it is desirable to heat the back surface of the substrate simultaneously with the irradiation of the substrate front surface with an ultraviolet light in the ultraviolet light irradiation step (G). The heating of the back surface permits further improving the effect produced by the ultraviolet light irradiation, i.e., the effect of removing organic materials. Further, it is desirable to cool the substrate after the ultraviolet light irradiation step whether or not the back surface of the substrate may be heated in the ultraviolet light irradiation step. Still further, in any case, it is desirable to reverse the substrate at the time intermediate between the first washing step (a) or (A) and the second washing step (b) or (B), and after the second washing step (b) or (B).

In the third aspect of the present invention, it is desirable for the washing apparatus to comprise an additional member of a cooling section for cooling the substrate such that the control means permits the substrate heated in the heating section to be cooled in the cooling section.

In the fourth aspect of the present invention, it is desirable for the washing apparatus to comprise an additional member of a cooling section for cooling the substrate such that the control means permits the substrate irradiated with an ultraviolet light in the ultraviolet light irradiation section and the substrate heated in the heating section to be cooled in the cooling section.

Further, in the washing apparatus according to each of the third and fourth aspects of the present invention, it is desirable to reverse the substrate by the substrate reversion means after the washing of the substrate in the first washing section and after the washing of the substrate in the second washing section.

Still further, the washing apparatus according to each of the third and fourth aspects of the present invention comprises a spin chuck for holding the substrate. It is desirable for the spin chuck to include a rotatable chuck, a plurality of stationary pins positioned to face or abut against outer peripheral regions of the substrate held on the chuck, and a plurality of movable pins which can be inclined such that these movable pins are capable of abutting against outer peripheral regions of the substrate so as to permit the substrate to be held by these stationary and movable pins.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2 is a perspective cross sectional view showing a washing unit included in the substrate washing apparatus shown in FIG. 1;

FIG. 3 is a plan view showing the washing unit included in the substrate washing apparatus shown in FIG. 1;

FIG. 4 is a plan view showing a spin chuck equipped with a mechanical holding mechanism (mechanical chuck mechanism) used in the washing unit;

FIG. 5 is a side view showing the lock mechanism of the mechanical chuck included in the spin chuck shown in FIG. 4;

FIG. 6 is a perspective cross sectional view showing a heating unit included in the substrate washing apparatus shown in FIG. 1;

FIG. 7 is a block diagram showing the control mechanism of the substrate washing apparatus shown in FIG. 1; and FIG. 8 is a flow chart showing a substrate washing method of the present invention.

DETAILED DESCRIPTION OF THE INVENTION

Figure 1:
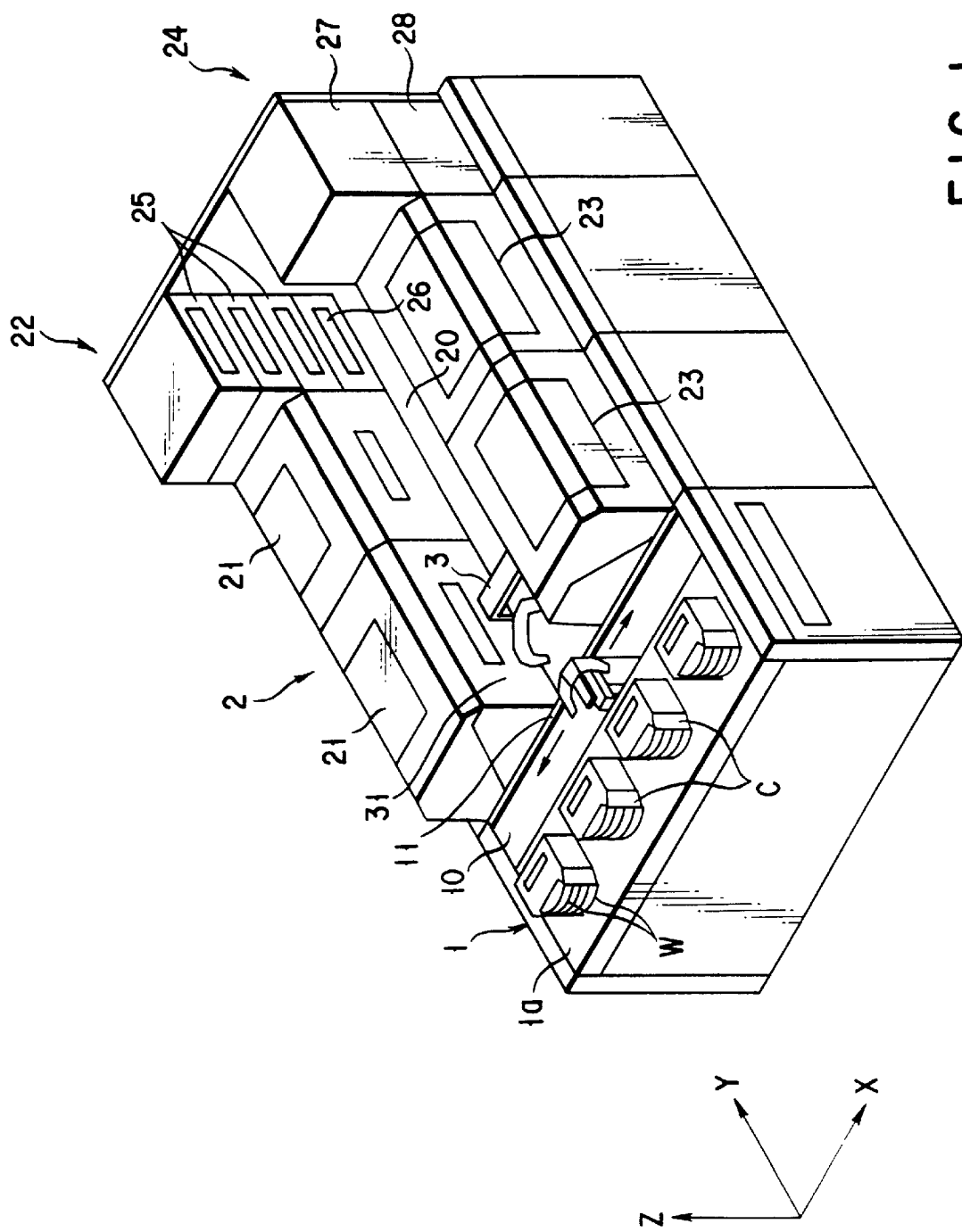
FIG. 1 is an oblique view showing the entire substrate washing apparatus of the present invention.

Let us describe preferred embodiments of the present invention with reference to the accompanying drawings. As shown in FIG. 1, a substrate washing apparatus of the present invention comprises a cassette station 1, a process station 2, a main arm mechanism 3 and a sub-arm mechanism 11. A cassette table 1a extending in an X-axis direction is formed in a front portion of the cassette station 1. A plurality of cassettes C are loaded on and unloaded from the cassette table 1a. A plurality of semiconductor wafers, e.g., 25 wafers, are horizontally arranged one upon the other within each cassette C.

The sub-arm mechanism 11, which is arranged in a rear portion of the cassette station 1, is movable in an X-axis direction along a sub-passageway 10 extending substantially in parallel with the cassette table 1a. Included in the sub-arm mechanism 11 are a wafer holder section, a back-and-forth driving mechanism for driving the wafer holder section back and forth within an XY plane, an X-axis driving mechanism for moving the wafer holder section in the X-axis direction, a Z-axis driving mechanism for moving the wafer holder section in a Z-axis direction, and a θ-swinging mechanism for swinging the wafer holder section about the Z-axis by an angle θ. A wafer W is taken out of the cassette C by the sub-arm mechanism and, then, delivered to the main arm mechanism 3.

A main passageway 20 extending in a Y-axis direction is formed in a central portion of the process station 2. The main arm mechanism 3 is movable along the main passageway 20. To be more specific, the main passageway 20 is joined to the sub-passageway 10 to form a T-shaped configuration. A plurality of process units 21 to 28 are arranged within the process station 2 in a manner to surround the main passageway 20. To be more specific, two front surface washing units 21 and a thermal process unit group 22 are arranged side by side on one side of the main passageway 20. On the other hand, two back surface washing units 23 and a reversion unit group 24 are arranged side by side on the other side of the main passageway 20. The thermal process unit group 22 includes three heating units 25 for heating the wafer W and a single cooling unit 26 for cooling the wafer. As apparent from the drawing, the three heating units 25, which are stacked one upon the other, are disposed on the cooling unit 26 to form a vertical arrangement.

As shown in FIG. 6, the uppermost heating unit 25 includes a lamp 86 emitting an ultraviolet light, with the result that the upper surface of the wafer W positioned below the lamp 86 is irradiated with the ultraviolet light.

The reversion unit group 24 includes a second unit 28 and a first unit 27 stacked on the second unit 28. The first unit 27, i.e., the upper stage unit, is equipped with only a reversion mechanism (not shown). On the other hand, the second unit 28, i.e., the lower stage unit, is equipped with an alignment unit (not shown) for aligning the wafer position in addition to a reversion unit for reversing the wafer W. These wafer reversion mechanism and alignment mechanism are disclosed in, for example, U.S. Pat. No. 5,498,294.

The main arm mechanism 3 includes a wafer holder section 31, a back-and-forth driving mechanism (not shown) for moving the wafer holder section 31 back and forth within an XY plane, a Y-axis driving mechanism (not shown) for moving the wafer holder section 31 in a Y-axis direction, a Z-axis driving mechanism (not shown) for moving the wafer holder section 31 in a Z-axis direction, and a θ-swinging mechanism (not shown) for swinging the wafer holder section 31 about the Z-axis by an angle θ. The operation of the main arm mechanism 3 is controlled by a CPU 90 included in a control section so as to permit the main arm mechanism 3 to load/unload the wafer W into and out of each of the process units 21 to 28 and to deliver and receive the wafer W to and from the sub-arm mechanism 11.

The front surface washing unit 21 and the back surface washing unit 23 are shown in detail in FIGS. 2 and 3. As shown in the drawings, each of the washing units 21 and 23 includes a main body 41, a spin chuck 42, a washing section 43, an ultrasonic wave water supply mechanism 44, and a rinsing nozzle 45. The washing section 43 is equipped with scrubbing mechanisms 51 to 57 for scrubbing the front surface, on which a thermal oxide film or the like is formed, of the wafer W supported by the spin chuck 42 for washing the front surface of the wafer W. A cup 46 serving to prevent a washing liquid or the like from being scattered to the outside is arranged to surround the spin chuck 42.

The spin chuck 42 comprises a base plate 42a sized somewhat larger than the wafer W. As shown in FIG. 4, three movable pins 71 and six stationary pins 72 are mounted along the outer periphery of the base plate 42a. The wafer W is mechanically held by these three movable pins 71 to prevent the wafer W from being moved on the base plate 42a.

As shown in FIG. 5, the movable pin 71 is L-shaped when viewed sideward to form a horizontal portion 71b and a vertical portion 71c. The L-shaped movable pin 71 is engaged with a pivotal shaft 71a at the bent portion of the pin 71. The horizontal portion 71b of the movable pin 71 is longer and heavier than the vertical portion 71c. Further, a spring 74 is mounted between the horizontal portion 71b of the movable pin 71 and the base plate 42a. Also, a piston rod 72a of a cylinder 73 is arranged right under the horizontal portion 71b of the movable pin 71.

The wafer W is locked by the lock mechanism described above. Specifically, when the piston rod 72a is retreated into the cylinder 73, the spring 74 urges downward the horizontal portion 71b of the movable pin 71 so as to allow the movable pin 71 to be inclined inward. As a result, the vertical portion 71c of the pin 71 abuts against the outer circumferential edge of the wafer W. In other words, the wafer W is locked by the movable pin 71 to prevent the wafer W from being moved. Further, when the wafer W is rotated together with the spin chuck, the vertical portion 71c of the pin 71 is further inclined inward centrifugally so as to firmly lock the wafer W without fail.

On the other hand, when the piston rod 72a is projected upward from within the cylinder 73, the horizontal portion 71*b* of the movable pin 71 is pushed upward by the rod 72*a* so as to allow the vertical portion 71*c* of the pin 71 to be inclined outward, with the result that the wafer W is unlocked. The particular lock mechanism for mechanically holding the wafer W permits the wafer W to be automatically aligned in respect of the process units 21, 23. This makes it possible to omit an aligning step in reversing the wafer W.

The holding means of the wafer W is not necessarily limited to the mechanical lock mechanism described above. In other words, it is also possible to employ other means such as a vacuum suction type chuck mechanism. In employing a vacuum suction type chuck mechanism, however, it is necessary to use in the reversing step of the wafer W a reversion unit 28 having an alignment mechanism.

As shown in FIGS. 2 and 3, the washing section 43 is arranged sideward of the base of the unit base body 41. The washing section 43 includes a supporting rod 57 and a horizontal arm 51 rotatably mounted to the supporting rod 57. Further, a brushing section 53 is mounted to a tip portion of the horizontal arm 51 with a shaft 54 interposed therebetween. The supporting rod 57 is mounted to the base body 41 and is supported by a support member 55. Also, a stepping motor 56 for rotating the brushing section 53 is mounted in an upper portion of the supporting rod 57. Further, arranged below the base body 41 are a stepping motor (not shown) for rotating the horizontal arm 51 and a cylinder (not shown) for vertically moving the brushing section 53.

The horizontal arm 51 is swingable about the support member 55 so as to permit the brushing section 53 to be swung from a home position denoted by an imaginary line (two dots-and-dash line) shown in FIG. 3 to the operating position right above the center of the wafer W. A brush cleansing section 58 is formed in the home position of the brushing section 53 so as to remove foreign matters attached to the scrubbing region of the brushing section 53, thereby to cleanse the scrubbing region. It is desirable to use a brush prepared by bundling resin fibers or sponge in the scrubbing region of the brushing section 53. Particularly, it is desirable to use a hard or soft sponge for forming the scrubbing region of the brushing section 53 used for washing the front surface of the wafer W.

The both surfaces of the wafer W are washed in the present invention as follows. In the first step, the brushing section 53 is moved upward away from the brush cleansing section 58. Then, the arm 51 is swung to move the brushing section 53 to the operating position right above the center of the wafer W, followed by moving downward the brushing section 53. As a result, the brushing section 53 abuts against the surface of the wafer W, as shown in FIG. 2. Under this condition, the wafer W is rotated together with the spin chuck. Also, the brushing section 53 is rotated about its own axis and, at the same time, swung to perform a reciprocating movement between the central portion and the peripheral portion of the wafer W. While the brushing section 53 is in contact with the surface of the wafer W, a washing liquid, e.g., pure water, is continuously supplied from a washing liquid supply source (not shown) to the scrubbing region of the brushing section 53.

As shown in FIGS. 2 and 3, the ultrasonic wave water supply mechanism 44 is arranged within the unit body 41 on the opposite side of the driving mechanism of the brushing section 53. To be more specific, the cup 46 is positioned in the central portion of the unit body 41, and the ultrasonic wave water supply mechanism 44 is arranged on one side of the cup 46, with the driving mechanism of the brushing section 53 being arranged on the opposite side. The ultrasonic wave water supply mechanism 44 includes a horizontal arm 61 swingably mounted to a supporting rod 63 and a nozzle 62 mounted to the tip of the horizontal arm 61. An ultrasonic wave generator (not shown) is mounted to the nozzle 62. An ultrasonic wave of a predetermined frequency, which is generated from the ultrasonic wave generator, is applied to the washing water which is to be supplied to the wafer. It follows that the foreign matter is effectively removed by the excited wafer from the wafer surface. Incidentally, it is possible to mount the ultrasonic wave generator (not shown) to a water supply circuit extending between the nozzle 62 and a water supply source (not shown). It should be noted that the supporting rod 63 is mounted to the unit body 41 with a support member 65 interposed therebetween. Also, the horizontal arm 61 is swung by a driving mechanism (not shown) so as to perform a reciprocating movement between a home position shown in FIG. 3, said home position being apart from the wafer W disposed on the spin chuck, and an operating position right above the center of the wafer W disposed on the spin chuck. A washing liquid excited by an ultrasonic wave is spurted from the nozzle 62 toward the wafer W. Incidentally, it is possible to use a washing mechanism utilizing a high pressure jet water in place of the ultrasonic wave water supply mechanism 44.

The rinsing liquid nozzle 45 is mounted outside the spin chuck 42. In order to wash away the residual foreign matter after the washing step of the wafer W, a rising liquid, e.g., pure water, is supplied from the nozzle 45 onto the upper surface of the wafer W. It is possible to control the spurting direction of the rinsing liquid from the rinsing liquid nozzle 45.

In each of the washing units 21 and 23 of the construction described above, the scrubbing region of the brushing section 53 is moved along and in contact with the surface of the wafer W while supplying a washing liquid onto the wafer W disposed on the spin chuck so as to scrub the wafer surface for the washing purpose. Alternatively, an ultrasonic wave water is supplied from the nozzle 62 onto the wafer W so as to wash the wafer surface. After the washing treatment, a rinsing liquid is supplied from the rinsing liquid nozzle 45 onto the wafer surface so as to wash away the residual foreign matter from the wafer surface. Finally, the wafer W is rotated about its own axis so as to centrifugally remove the liquid attached to the wafer surface and, thus, to dry the wafer surface.

FIG. 6 shows the heating unit 25. The heating unit 25 includes a heating mechanism for further drying the wafer W from which the liquid attached to the wafer has already been centrifugally removed in the previous step. To be more specific, the heating unit 25 includes a box 80 and a heating plate 82 arranged within the box 80 for heating the wafer W for the drying purpose. The heating plate 81 is arranged to allow its surface to form a horizontal plane. A heater (not shown) whose power source is controlled by the CPU 90 is mounted to the heating plate 81.

A plurality of spacers 82 are mounted on the surface of the heating plate 81, and the wafer W is supported by these spacers 82, with the result that the wafer W is not in direct contact with the heating plate 81 to constitute a so-called "proximity heating system". In this heating system, a direct contact between the wafer W and the heating plate 81 is avoided, and the wafer W is heated by the neat radiated from the heating plate 81. Naturally, the foreign matter attached to the heating plate 81 is not transferred onto the wafer W, making it possible to prevent the wafer W from being contaminated with the foreign matter attached to the heating plate 81. A positioning member 83 is screwed to each of the spacers 82 so as to align the wafer W as desired. To be more specific, the positioning member 83 is shaped conical as apparent from the drawing.

Naturally, the edge portion of the wafer W abutting against the positioning member 83 is gravitationally slid downward along the inclined side surface of the positioning member 83, with the result that the wafer W is self-aligned as desired.

A plurality of lift pins 84 are mounted to a driving mechanism 85. Also, the heating plate 81 is provided with a plurality of through holes. The lift pins 84 are moved up and down by the driving mechanism 85 through the holes made in the heating plate 81. When the wafer W is loaded in the box 80, the lift pins 84 are moved upward to project from the holes made in the heating plate 81 so as to receive the wafer W. In the unloading step of the wafer W, the lift pins 84 are moved further upward to move upward the wafer W. On the other hand, in the heating step for the drying purpose, the lift pins 84 are moved downward so as to be retreated into the heating plate 81.

The ultraviolet light irradiation lamp 86 is arranged in an upper wall region of the box 80 included in the uppermost heating unit 25 so as to be positioned above the wafer W. As a result, the upper surface of the wafer W is irradiated with the ultraviolet light emitted from the lamp 86 and, thus, organic materials attached to the wafer surface are removed. If the front surface of the wafer W is irradiated with the ultraviolet light while heating the back surface of the wafer W by the heat radiated from the heating plate 81, the organic materials can be removed more effectively from the front surface of the wafer W. The ultraviolet light irradiation should be performed, as desired, prior to the washing step with a washing liquid.

The wafer W heated in the heating unit 25 is cooled in the cooling unit 26. In this cooling unit, the wafer W is disposed on a cooling plate with spacers interposed therebetween so as to carry out cooling by the proximity cooling system.

The control system used in the apparatus of the present invention is shown in FIG. 7. In the washing apparatus of the present invention for washing both surfaces of a substrate, a series of processing operations are controlled by the CPU 90 based on a predetermined recipe. As shown in FIG. 7, a memory 93 is connected to the CPU 90. The recipe corresponding to the various washing sequences, which are described herein later, is stored in the memory 93. An operator selects a desired sequence so as to transmit an electric signal from an operating section 91 to the CPU 90. As a result, a recipe controller 92 selects the desired recipe. Based on the selected recipe, the CPU 90 controls the power source for each of the process units 21, 23, 25, 26, 27, 28, the transfer mechanism 3 and the ultraviolet light lamp 86.

In the apparatus for washing both surfaces of an object constructed as described above, the sub-arm 11 gains access to the cassette C housing untreated wafers W and disposed on the cassette table 1a included in the cassette station 1 so as to take out a single wafer W from within the cassette C. The wafer W thus taken out of the cassette C is centered and, then, delivered onto the main arm 31 of the transfer mechanism 3 included in the process station 2.

In the next step, the wafer W on the main arm 31 is transferred into a predetermined process unit in accordance with a predetermined recipe and, then, is further transferred by the main arm 31 into each process unit based on the recipe noted above so as to carry out a series of treatments.

In the embodiments described above, the basic recipe of the treatment includes the step of washing the front surface of the wafer W in the front surface washing unit 21, the step of reversing the wafer in the reversion unit 27 or 28, the step of washing the back surface of the wafer W in the back surface washing unit 23, and an additional reversion of the wafer in the first reversion unit 27 or the second reversion unit 28. Further, additional steps of heating for drying after each of the washing steps and an ultraviolet light irradiation prior to the step of washing the front surface of the wafer in the front surface washing unit are selectively incorporated into the basic recipe by the operation in the operating section 91. Based on the resultant recipe, the recipe controller 92 selects a desired recipe to enable the CPU 90 to control each of the process units, the transfer mechanism and the ultraviolet light lamp on the basis of the selected recipe. To be more specific, the recipe controller 92 selects one of six recipes R1 to R6 shown in FIG. 8.

Let us describe more in detail each of the recipes R1 to R6 with reference to FIG. 8. When it comes to recipe R1, the sub-arm mechanism 11 takes a single wafer W out of the cassette C in the cassette station 1 and delivers the wafer W onto the main arm mechanism 3 (step ST1). Then, the main arm mechanism 3 transfers the wafer W into the uppermost heating unit 25 so as to form a silicon oxide film by means of thermal oxidation on the front surface of the silicon wafer W acting as a substrate to be processed. In recipe R1, the front surface of the wafer W is irradiated with an ultraviolet light for about three seconds within the heating unit 25 so as to improve the quality of the silicon oxide film (thermal oxide film), so as to remove the organic materials attached to the wafer surface, and so as to prevent particles from being attached to the surface of the oxide film (step ST2). During the ultraviolet light irradiation step ST2, the back surface (lower surface) of the wafer W is heated. It is desirable to heat the back surface of the wafer W in step ST2 at the temperature falling within a range of between 90° C. and 120° C. The combination of the ultraviolet light irradiation and heating is effective for increasing the effects of improving the quality of the silicon oxide film and of improving the removal of the organic materials from the front surface of the wafer W. After step ST2, the wafer is transferred into the cooling unit 26 to cool the wafer W to room temperature (step ST3).

In the next step, the wafer W is transferred by the main arm mechanism 3 into any one of the front surface washing units 21 to have the front surface of the wafer W scrubbed for the washing purpose (step ST4). In this front surface washing step ST4, it is desirable to use a soft or hard sponge for forming the scrubbing member. It is also desirable to control finely the pressure applied from the sponge to the wafer W. Further, in this front surface washing step ST4, the wafer W is rotated about its own axis at a high speed so as to centrifugally remove the liquid material attached to the wafer surface.

Then, the wafer W is transferred by the main arm mechanism 3 into any one of the heating units 25 for heating the wafer so as to further dry the surface (step ST5). The heating temperature in the step ST5 should desirably fall within a range of between 90° C. and 120° C. After the drying in step ST5, the wafer W is transferred by the main arm mechanism 3 into the cooling unit 26 for cooling the wafer to room temperature (step ST6). Further, the wafer W is transferred by the main arm mechanism 3 into the reversion unit 27 or 28 for reversing the wafer W upside down (step ST7).

In the next step, the wafer W is transferred by the main arm mechanism 3 into any one of the back surface washing units 23 so as to have the back surface of the wafer W scrubbed for the washing purpose (step ST8). It is desirable to use a brush prepared by bundling synthetic resin fibers in the back surface washing step ST8. Further, the wet wafer W is rotated about its own axis at a high speed within the washing unit 23 so as to centrifugally remove the liquid material attached to the wafer surface. Then, the wafer W is transferred by the main arm mechanism 3 into the reversion unit 27 or 28 so as to reverse the wafer W upside down (step ST8).

After step ST8, the wafer W is transferred by the main arm mechanism 3 into any one of the heating units 25 for heating the wafer W so as to further dry the surface (step ST10). It is desirable to heat the wafer W in step ST10 at the temperature falling within a range of between 90° C. and 120° C. Then, the wafer W is transferred into the cooling unit 26 for cooling the wafer W to room temperature (step ST11). Finally, the treated wafer W is brought back into the cassette C in the cassette station 1 so as to finish a series of treatments (step ST12).

As described above, in the process of recipe R1, the organic materials attached to the wafer surface can be removed in the ultraviolet light irradiation step ST2 so as to cleanse the wafer surface. Further, in the heating step ST5 for the drying purpose after the step of washing the front surface of the wafer, the wafer W is dried under heat. Also, the wafer W is dried again under heat in the heating step ST10 after the step of washing the back surface of the wafer W so as to dry completely both surfaces of the wafer W.

Let us describe recipes R2 to R7. Specifically, recipe R2 is substantially equal to recipe R1 described above, except that the ultraviolet light irradiation step ST2 and the cooling step ST3 are removed from recipe R1 for preparing recipe R2. Recipe R2 is employed where it is unnecessary to remove organic materials.

Recipe R3 is substantially equal to recipe R1 described above, except that the heating step ST5 for the drying purpose after the washing of the front surface of the wafer W and the subsequent cooling step ST6 are removed from recipe R1 for preparing recipe R3. Recipe R3 is selected where it suffices in view of the desired drying condition to employ the heating step ST10 alone for the drying purpose after the step of drying the back surface of the wafer W.

Recipe R4 is substantially equal to recipe R3, except that the ultraviolet light irradiation step ST2 and the cooling step ST3 are removed from recipe R3 for preparing Recipe R4. Recipe R4 is selected where it suffices to employ the heating step ST10 alone for the drying purpose after the step of drying the back surface of the wafer W and it is unnecessary to remove the organic materials from the wafer surface.

Recipe R5 is substantially equal to recipe R3, except that the heating step ST10 for the drying purpose after the step of washing the back surface of the wafer W and the cooling step ST11 are removed from recipe R3 for preparing Recipe R5. Recipe R5 is selected where the liquid material attached to the wafer W can be sufficiently removed centrifugally by the rotation of the wafer W about its own axis.

Recipe R6 is substantially equal to recipe R5, except that the ultraviolet light irradiation step ST2 and the cooling step ST3 are removed from recipe R5 for preparing Recipe R6. Recipe R6 is selected where it suffices to employ the heating step ST10 alone for the drying purpose after the step of drying the back surface of the wafer W and it is unnecessary to remove the organic materials from the wafer surface.

As described above, the heating for the drying purpose after the substrate washing can be performed in various modes in the present invention. In addition, the ultraviolet light irradiation before the washing step can be employed selectively. It follows that the washing treatment achieved in the present invention has a high degree of freedom so as to be capable of coping with various specifications of the treatment.

The present invention is not limited to the embodiments described above. In other words, the present invention can be embodied in various modified fashions. For example, in the embodiments described above, the ultraviolet light irradiation is selectively employed. However, it is possible to have the ultraviolet light irradiation included in any type of the treatment. By contraries, the ultraviolet light irradiation can be eliminated from any type of the treatment.

Also, in the embodiments described above, the front surface of the semiconductor wafer is washed first, followed by washing the back surface of the wafer. However, it is possible to wash the back surface first. Further, the substrate to be processed need not be limited to a semiconductor wafer. In other words, it is possible to employ the technical idea of the present invention for the processing of other substrates such as an LCD substrate, a glass substrate, a CD substrate, a photo mask, and a printed circuit substrate.

To reiterate, the heating for the drying purpose after the substrate washing can be performed in various modes in the present invention. In addition, the ultraviolet light irradiation before the washing step can be employed selectively. It follows that the washing treatment achieved in the present invention has a high degree of freedom so as to be capable of coping with various specifications of the treatment. In addition, the ultraviolet light irradiation can also be employed selectively, leading to a further improved degree of freedom in the washing treatment.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An apparatus for washing both surfaces of a substrate, comprising:

a spin chuck for holding and rotating a substrate;

a first washing section in which a scrubbing member is brought into contact with a front surface of a substrate, which is kept rotated, while supplying a washing liquid onto said front surface of the substrate for washing the front surface;

a second washing section in which a scrubbing member is brought into contact with a back surface of the substrate, which is kept rotated, while supplying a washing liquid onto said back surface of the substrate for washing the back surface;

a heating section for drying under heat the front and back surfaces of the substrate;

a transfer arm mechanism for transferring the substrate into each of said first washing section, said second washing section, and said heating section;

a recipe controller for controlling said first and second washing sections to permit the substrate to be washed in the second washing section after the substrate washing in the first washing section, and for determining whether the substrate should be dried in said heating section, between the washing in the first washing section and the washing in the second washing section and after the washing in the second washing section, respectively, whether the substrate should be dried only once after the washing in the second washing section, or whether the substrate should not be dried in the heating section; and control means for controlling the heating in the heating section on the basis of the recipe determined in said recipe controller.

2. The washing apparatus according to claim 1, further comprising a cooling section for cooling the heated substrate, wherein said recipe controller selects a recipe in which the substrate is heated in said heating section and, then, cooled in said cooling section.

3. An apparatus for washing both surfaces of a substrate, comprising:

an ultraviolet light irradiation section equipped with ultraviolet light irradiating means for irradiating a front surface of a substrate with an ultraviolet light;

a spin chuck for holding and rotating a substrate;

a first washing section in which a scrubbing member is brought into contact with a front surface of a substrate, which is kept rotated, while supplying a washing liquid onto said front surface of the substrate for washing the front surface;

a second washing section in which a scrubbing member is brought into contact with a back surface of the substrate, which is kept rotated, while supplying a washing liquid onto said back surface of the substrate for washing the back surface;

a heating section for drying under heat the front and back surfaces of the substrate;

a transfer arm mechanism for transferring the substrate into each of said first washing section, said second washing section, and said heating section;

a recipe controller for controlling said first and second washing sections to permit the substrate to be washed in the second washing section after the substrate washing in the first washing section, for determining whether an ultraviolet light irradiation should be performed by said ultraviolet light irradiation means before the washing in the first washing section, and for determining whether the substrate should be dried between the washing in the first washing section and the washing in the second washing section and after the washing in the second washing section, respectively, whether the substrate should be dried only once after the washing in the second washing section, or whether the substrate should not be dried in the heating section; and control means for controlling the heating in the heating section on the basis of the recipe determined in said recipe controller.

4. The washing apparatus according to claim 3, further comprising a cooling section for cooling the heated substrate, wherein said recipe controller selects a recipe in which the substrate is heated in said heating section and, then, cooled in said cooling section.

5. The washing apparatus according to claim 3, further comprising substrate heating means in which ultraviolet light irradiation means is used for heating the substrate during the ultraviolet light irradiation.

6. The washing apparatus according to any one of claims 1 and 3, further comprising substrate inverting means for inverting the substrate, wherein said control means permits said substrate inverting means to again invert the substrate after the front surface washing of the substrate in the first washing section and after the back surface washing of the substrate in the second washing section.

7. The washing apparatus according to any one of claims 1 and 3, wherein said spin chuck includes a plurality of stationary pins facing or abutting against the outer circumferential peripheral region of the substrate and a plurality of movable pins mounted in a manner to be capable of inclination so as to be capable of abutting against the outer circumferential peripheral region of the substrate so as to hold the substrate.

* * * * *